(12) United States Patent
Thomas

(10) Patent No.: US 7,787,286 B2
(45) Date of Patent: Aug. 31, 2010

(54) SRAM MEMORY WITH REFERENCE BIAS CELL

(75) Inventor: Olivier Thomas, Revel (FR)

(73) Assignee: Commissariat a l'Energie Atomique, Paris (FR)

( * ) Notice: Subject to any disclaimer, the term of this patent is extended or adjusted under 35 U.S.C. 154(b) by 122 days.

(21) Appl. No.: 12/235,870

(22) Filed: Sep. 23, 2008

(65) Prior Publication Data

US 2009/0080237 A1    Mar. 26, 2009

(30) Foreign Application Priority Data

Sep. 24, 2007    (FR) .................................. 07 57792

(51) Int. Cl.
*G11C 11/00* (2006.01)
(52) U.S. Cl. .............. 365/154; 365/210.14; 365/189.09
(58) Field of Classification Search ................. 365/154, 365/210.14, 189.09
See application file for complete search history.

(56) References Cited

U.S. PATENT DOCUMENTS

| | | | |
|---|---|---|---|
| 5,793,671 A | 8/1998 | Selcuk | |
| 5,852,572 A | 12/1998 | Jung et al. | |
| 5,965,914 A | 10/1999 | Miyamoto | |
| 6,442,060 B1 | 8/2002 | Leung et al. | |
| 6,529,400 B1 | 3/2003 | Bhavnagarwala et al. | |
| 6,731,533 B2 | 5/2004 | Deng et al. | |
| 7,082,076 B2 * | 7/2006 | Terzioglu et al. | 365/230.06 |
| 2005/0094434 A1 | 5/2005 | Watanabe et al. | |
| 2005/0161739 A1 | 7/2005 | Anderson et al. | |
| 2006/0187700 A1 | 8/2006 | Ho | |
| 2006/0274569 A1 | 12/2006 | Joshi et al. | |
| 2007/0139072 A1 | 6/2007 | Yamaoka et al. | |
| 2007/0189060 A1 | 8/2007 | Inaba | |

(Continued)

FOREIGN PATENT DOCUMENTS

EP    1465200 A1    10/2004

(Continued)

OTHER PUBLICATIONS

Flautner et al, "Drowsy Caches: Simple Techniques for Reducing Leakage Power", International Symposium on Computer Architecture, 2002, pp. 148-157, vol. 30, issue 2, Arizona, USA.

(Continued)

*Primary Examiner*—Thong Q Le
(74) *Attorney, Agent, or Firm*—Pearne & Gordon LLP

(57) ABSTRACT

A random access memory microelectronic device, comprising a plurality of cells comprising respectively: a plurality of transistors forming a bistable, a first storage node and a second storage node, a first double gate access transistor to the first storage node and a second double gate access transistor to the second storage node, a first gate of the first access transistor and a first gate of the second access transistor being linked to a first word line, a second gate of the first access transistor and a second gate of the second access transistor being linked to a second word line, the device being moreover equipped: with a reference memory cell provided to deliver a bias potential intended to be applied to one of the respective word lines of one or several given cells of said plurality of cells during reading access of said given cells.

13 Claims, 7 Drawing Sheets

U.S. PATENT DOCUMENTS

2007/0211519 A1  9/2007  Thomas et al.

FOREIGN PATENT DOCUMENTS

FR   2898432 A1   10/2006
WO   2006108987 A1   10/2006

OTHER PUBLICATIONS

Chandrakasan et al, "Design of High-Performance Microprocessor Circuits", IEEE Press, 2001, pp. 285-308.

Kim et al, "PVT-Aware Leakage Reduction for On-Die Caches with Improved Read Stability", IEEE International Solid-State Conference, Session 26, 2005, pp. 13-15.

Seevinck et al, "Static-Noise Margin Analysis of MOS SRAM Cells", IEEE Journal of Solid-State Circuits, Oct. 1987, pp. 748-754, vol. SC-22, No. 5.

Agarwal et al, "DRG-Cache: A Data Retention Gated-Ground Cache for Low Power", Design Automated Conference, 2002, pp. 473-478, ACM, New Orleans, Louisiana, USA.

Ananthan et al, "FinFET SRAM—Device and Circuit Design Considerations", Purdue University, West Lafayette, IN, Jun. 2004.

Azizi et al, "Low-Leakage Asymmetric-Cell SRAM", IEEE VLSI, 2003, pp. 701-715, vol. 11, No. 4, IEEE Educational Activities Department, Piscataway, NJ, USA.

Lu et al, "Characteristics and Mechanisms of Tunable Work Function Gate Electrodes Using a Bilayer Metal Structure on Si02 and HfO2", IEEE Electron Device Letters, 2005, pp. 445-447, vol. 26, No. 7, Institute of Electrical and Electronics Engineers, New York, NY.

Yamaoka et al, "Low Power SRAM Menu for SOC Application Using Yin-Yang-Feedback Memory Cell Technology", Central Research Laboratory, Tokyo Japan Jun. 2002.

Takeuchi et al, "A Study of the Threshold Voltage Variation for Ultra-Small Bulk and SOI CMOS", IEEE Transactions on Electronic Devices, 2001, pp. 1995-2001, vol. 48, No. 9, Piscataway, NJ, USA.

Thomas et al, "Ultra Low Voltage Design Considerations of SOI SRAM Memory Cells", IEEE, 2003, pp. V-401-V-404, vol. 4, ISEP, Paris, France.

Ilicali et al, "Planar Double Gate Transistors with Asymmetric Independent Gates", IEEE Interantional ISOI Conference, 2005, pp. 126-127, New York, USA.

Kim et al, "Back-Gate Controlled Read SRAM with Improved Stability", IEEE ISOI Conference, 2005, pp. 211-212, Hawaii, USA.

Kedzierski et al, "High-performance symmetric-gate and CMOS-compatible Vt asymmetric-gate FinFET devices", IEDM, 2001, pp. 437-440, Washington, DC, USA.

Osada et al, "16.7-fA./Cell Tunnel-Leakage-Suppressed 16-Mb SRAM for Handling Cosmic-Ray-Induced Multierrors", IEEE Journal of Solid-State Circuits, 2003, pp. 1952-1957, vol. 38, No. 11.

Takeda et al, "A 16-Mb 400-MHz Loadless CMOS Four-Transistor SRAM Macro", IEEE Journal of Solid-State Circuits, 2000, pp. 1631-1640, vol. 35, issue 11, San Francisco, CA, USA.

Mathew et al, "CMOS Vertical Multiple Independent Gate Field Effect Transistor (MIGFET)", IEEE international SOI conference, 2004, pp. 187-189, IEEE, Piscataway NJ.

Mathew et al, "Multiple Independent Gate Field Effect Transistor (MIGFET)- Multi-Fin RF Mixer Architecture, Three Independent Gates (MIGFET-T) Operation and Temperature Characteristics", Symposium on VLSI Technology, 2005, pp. 200-201, Austin, Texas, USA.

Vinet et al, "Planar Double Gate CMOS Transistors with 40nm metal gate for multipurpose applications", International Conference on Solid State Devices and Materials, 2004.

Maegawa et al, "A 0.4μm Gate-All-Around TFT (GAT) Using a Dummy Nitride Pattern for High-Density Memories", Japanese journal of applied physics, 1995, pp. 895-899, vol. 34, No. 2B, Part 1, Japanese journal of applied physics, Tokyo, Japan.

French Preliminary Search Report dated Jan. 17, 2008.

Thomas et al; "An SOI 4 Transistors Self-Refresh Ultra-Low-Voltage Memory Cell", ISEP, 21 ISCAS, Thailand, Bangkok, May 2003.

Thomas et al; "Self-Adjusted back gate bias to optimize SRAM cells stability".

Thomas et al; "Sub-1V, Robust and Compact 6T SRAM cell in Double Gate MOS technology".

* cited by examiner

SRAM MEMORY WITH REFERENCE BIAS CELL

TECHNICAL FIELD

The invention relates to the field of SRAM (static random access memory), and concerns in particular an improved SRAM memory cell structure, as well as a SRAM memory. The present invention provides in particular for a static random access memory cell structure developed in double gate technology and equipped with transistors comprising two gates commanded independently of each other, the performances of which in terms of reading current and reading static noise margin are improved.

STATE OF THE PRIOR ART

A conventional SRAM memory cell (SRAM for static random access memory) generally comprises two inverters INV1, INV2, connected according to a configuration known as "flip-flop" and two access transistors $TA_T$, $TA_F$ connected to lines known as bit lines BLT and $BL_F$, and commanded by a word line WL.

The desired characteristics for a memory cell are:
- a good stability during the different reading, writing and retention operations carried out on the cell,
- a conduction or charge current as high as possible to give the cell a high operating speed,
- a minimum size of cell to enable a memory to be produced with a high cell integration density,
- the lowest possible retention current in order to minimise the static consumed power.

These criteria are contradictory with each other and lead the designers of memories to make compromises.

SRAM cells with six transistors, known as "6T cells", offer a good compromise between all of the above mentioned criteria.

By seeking to reduce more and more the sizes of the transistors of memory cells, the parameters of the transistors such as their channel width W, their channel length L, their threshold voltage $V_T$, their permeability $\mu_0$, their Na doping, their gate oxide thickness Tox fluctuate more and more, as indicated in the documents [TAK'01] and [YAM'04]. This leads to an increase in the sensitivity of the memory cells faced with the different noise sources such as the capacitive coupling, the inductive coupling, the supply noise, due to dispersions between the transistors.

Nowadays, the increase in dispersions between transistors makes it necessary to find novel more robust memory cells with a satisfactory size.

The stability of a cell may be determined particularly by its static noise margin SNM in reading mode, as is disclosed in the document [SEE'87]. During reading access of a SRAM cell, the gain of the inverters is reduced by turning on the access transistors. In order to cancel this effect, a cell with 10 transistors, in which, during a reading cycle, the storage nodes and the bit lines are decoupled, has been proposed in the document [CHA'01].

A memory cell with 8 transistors produced in double gate technology having an operation similar to that comprising 10 transistors evoked previously, has for its part been disclosed in the document [KIM'05]. Despite a significant improvement in the static noise margin SNM, cells with 10 transistors and with 8 transistors have a very large size compared to 6T cells.

In the document FR 2 898 432 a 6T memory cell in double gate technology is disclosed. Such a cell comprises access transistors commanded by two word lines activated independently of each other, the bias of which depends on the operating mode (reading, writing or retention) in which the cell is placed. This cell comprises a significantly improved reading static noise margin compared to conventional cells, while at the same time having a satisfactory size. The limit of such a cell is however a low reading current.

The aim of the present invention is to find a novel structure of SRAM memory cell, having a good reading static noise margin, while at the same time having electrical performances in particular in terms of improved reading current.

DESCRIPTION OF THE INVENTION

The invention firstly concerns a random access memory microelectronic device, comprising a plurality of cells comprising respectively:
- a plurality of transistors forming a bistable,
- a first storage node and a second storage node,
- a first double gate access transistor to the first storage node and a second double gate access transistor to the second storage node, a first gate of the first access transistor and a first gate of the second access transistor being linked to a first word line, a second gate of the first access transistor and a second gate of the second access transistor being linked to a second word line, the device being further equipped: with at least one reference memory cell provided to deliver a bias potential provided to be applied to one of the respective word lines of one or several given cells of said plurality of cells at least during reading access of said given cells.

The bias potential applied during a reading operation of the cell can be within the range of bias potentials applied in retention and writing operations of the cell.

The reference cell may comprise: a first reference storage node and a second reference storage node, said bias potential delivered by the reference memory cell being dependent on a predetermined reference potential.

The reference cell may comprise: a first reference storage node and a second reference storage node, said bias potential delivered by the reference memory cell being dependent on a predetermined reference potential and being adapted as a function of the variations in a potential of the second reference node of the reference cell.

The second reference node may be for example a node intended to store a '0' logic information.

According to one embodiment possibility, the reference cell may comprise: means forming a feedback loop, in particular negative, provided to reduce the potential of the second reference node of the reference cell following an increase in potential of the second reference node.

According to one embodiment possibility of the feedback loop, said loop may comprise means forming an operational amplifier comprising:
- an inverter input connected to the second node of the reference cell,
- a non-inverting input to which the reference predetermined potential is applied,
- an output delivering said bias potential.

The first word line may be suited to be placed at a first potential value, for example VSS, or at a second potential value for example VDD, the reference potential being provided so that the bias potential is higher than VSS and lower than VDD.

According to one possibility, the reference cell may further comprise:

a plurality of transistors forming a bistable, a first double gate access transistor to the first reference node and a second double gate access transistor to the second reference node, a first gate of the first access transistor and a first gate of the second access transistor being linked to a first word line, a second gate of the first access transistor and a second gate of the second access transistor being linked to a second word line provided to deliver said bias potential.

The first word line of the reference cell may be at a potential provided to assure the conduction of access transistors of the reference cell, whereas the given bias potential is carried by the second word line of the reference cell.

According to one possible implementation of the reference cell, said cell may comprise a plurality of transistors having an identical layout to that of the transistors of the cells of said plurality of cells. The transistors of the reference cell may be identical and have a size identical to that of the transistors of the other cells of the matrix.

The random access memory according to the invention may further comprise:

means for placing the first word line of one or several cells, at a first potential or at a second potential, means for placing the second word line of one or several cells, at said first potential or at said given bias potential.

Said given bias potential may be intended to be applied to one of the respective word lines of one or several given cells of said plurality of cells during writing access of said given cells.

According to an alternative embodiment, the random access memory according to the invention may further comprise:

means for placing the first word line of one or several cells, at a first potential or at a second potential, means for placing the second word line of one or several cells, at said first potential or at said second potential or at said given bias potential.

Different bias potentials are intended to be applied to one of the respective word lines of one or several given cells of said plurality of cells according to whether said given cells are accessed in reading, in writing or are in retention mode.

BRIEF DESCRIPTION OF DRAWINGS

The present invention will be better understood on reading the description of embodiments given solely by way of indication and in no way limiting and by referring to the appended figures in which.

Identical, similar or equivalent parts of the different figures bear the same number references so as to make it easier to go from one figure to the next.

In order to make the figures more legible, the different parts represented in the figures are not necessarily to a uniform scale.

DETAILED DESCRIPTION OF SPECIFIC EMBODIMENTS

The invention implements a random access memory (RAM) structure equipped with cells comprising transistors produced in double gate technology, for example of CMOS type (CMOS for Complementary Metal Oxide Semi-conductor). "Double gate technology" is taken to mean that these transistors comprise two gates $G_1$, $G_2$ in the form of a first and a second zone of gate material(s), formed on either side of an active zone, and linked or connected respectively to bias means. The two zones of gate material(s) may if appropriate be distinct or separated from each other and not be connected to each other or not be electrically linked to each other.

A random access memory cell structure according to the invention comprises a series of transistors, for example access transistors, equipped with two electrically independent gates, or which are not connected to each other, and which are linked respectively to first bias means, and to second bias means, distinct from the first bias means. The first bias means and the second bias means may comprise respectively: a first conductive or connection line known as "first word line", suited to carrying a bias potential, and a second conductive or connection line known as "second word line", suited to carrying a second bias potential. The cell further comprises another series of transistors, for example conduction or charge transistors, comprising a double gate formed of two gates electrically linked to each other, or connected to each other.

The transistors of the cell are also implemented in such a way that the current between the drain and the source Ids is capable of adopting at least 3 different levels depending on the manner in which their 2 gates are respectively biased.

Figure 1:
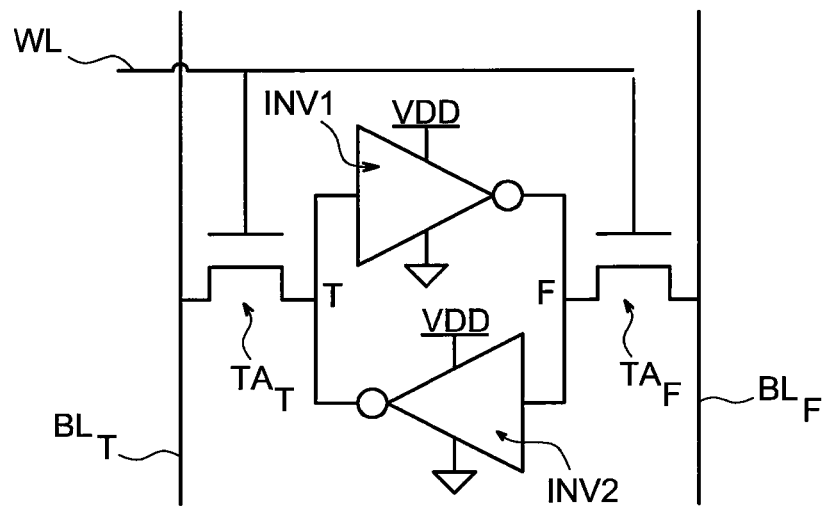
FIG. 1 illustrates an example of static memory cell according to the prior art.
Figure 2:
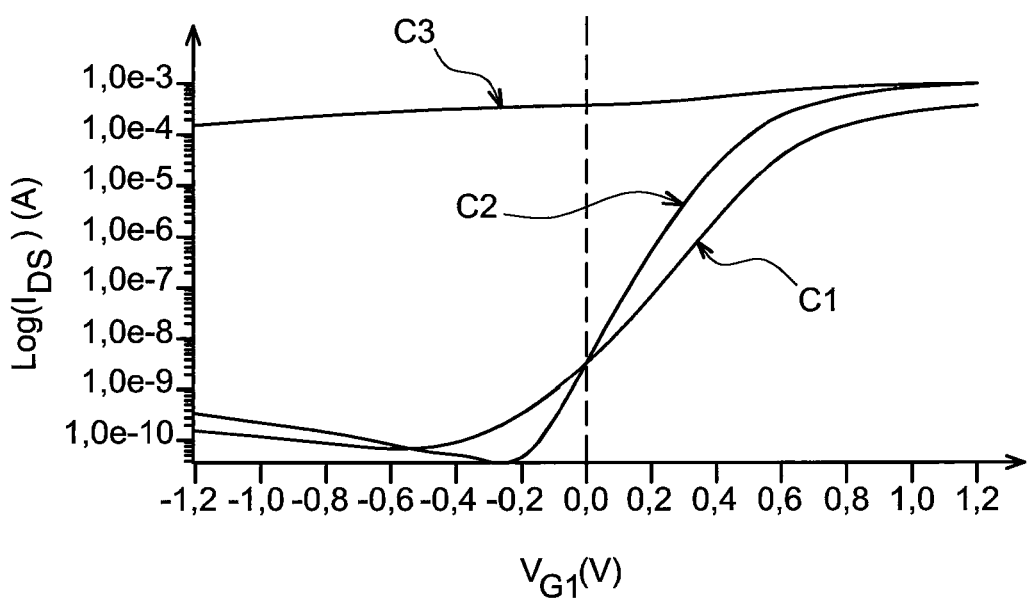
FIG. 2 illustrates an example of current-voltage characteristic of a double gate transistor.

Electrical characteristics of a double gate transistor of a memory cell implemented according to the invention are illustrated in FIG. 2B, on which three bias curves $C_1$, $C_2$, $C_3$, are given.

In this figure, a first bias curve $C_1$ is representative of the evolution of the drain-source current Ids as a function of a potential Vg1 applied to a first gate of the transistor, when the second gate of the transistor is in a first bias state and that a potential Vg2=0 Volt is applied to the second gate. The first curve $C_1$ shows that for a bias such that a potential Vg2=0 Volt is applied to the second gate, it is possible to obtain the lowest current $I_{OFF}$ in the blocked state and the lowest saturation current $I_{ON2}$ of the transistor.

A second bias curve $C_2$ is representative of the evolution of the drain-source current Ids as a function of a potential Vg1 applied to the first gate of the transistor, when the second gate of the transistor is in a second bias state and that a potential Vg2=Vg1 is applied to the second gate. The second curve $C_2$ shows that for a bias such that a potential Vg2=Vg1 is applied to the second gate, it is possible to attain the lowest current $I_{OFF}$ in the blocked state of the transistor and the highest current $I_{ON1}$ in the saturated state. A bias such as Vg2=Vg1 may enable the highest $I_{ON}/I_{OFF}$ ratio of the current in the saturated state compared to the current in the blocked state to be obtained.

A third bias curve $C_3$ is representative of the evolution of the drain-source current Ids as a function of a potential Vg1, applied to the first gate of the transistor, when the second gate of the transistor is in a third bias state and that a potential Vg2=VDD, with VDD a supply potential of the cell, is applied to the second gate. For the third bias state such that Vg2=VDD, it is possible to obtain, when Vg1=VDD, the highest saturation current $I_{ON1}$ of the transistor and, when Vg1=0 Volt, the lowest saturation current $I_{ON2}$ of the transistor.

Figure 3:
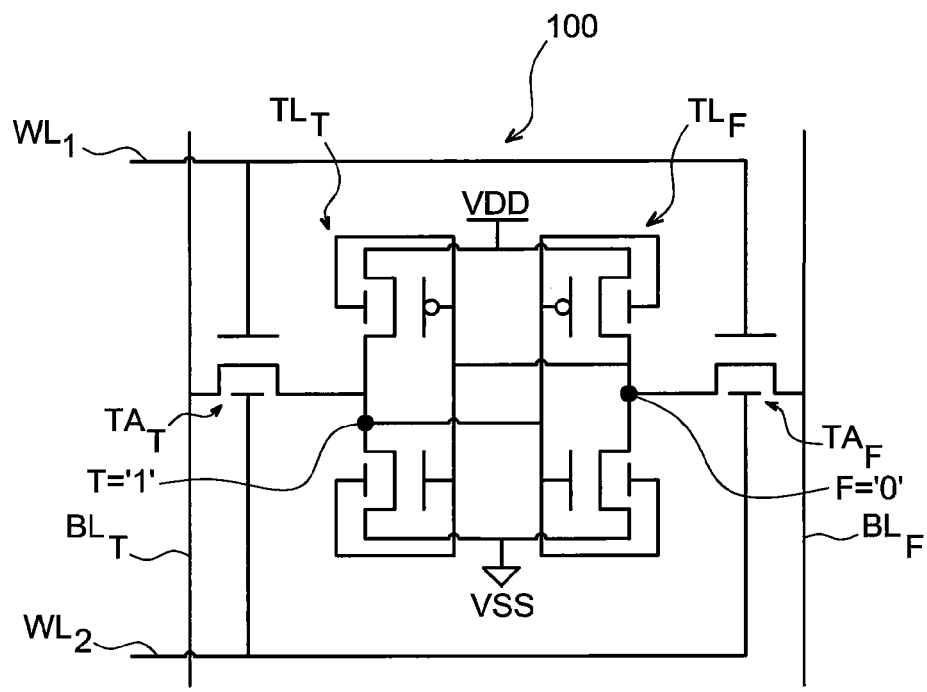
FIG. 3 illustrates an example of memory cell according to the invention, equipped with 6 double gate transistors and two word lines.

An example of memory cell or a memory cell, integrated in a SRAM memory according to the invention, is illustrated in FIG. 3. This cell 100, is a cell known as "6T", equipped with 6 transistors produced for example in double gate MOS technology (MOS for Metal Oxide Semi-conductor).

The cell 100 comprises a first double gate charge transistor $TL_T$, as well as a second double gate charge transistor $TL_F$. The charge transistors $TL_T$ and $TL_F$, may be produced in a first type of given MOS technology, for example a PMOS type technology. The two gates of the first double gate charge transistor $TL_T$ are connected together, whereas the two gates of the second double gate charge transistor $TL_F$ are also connected together. The double gate of the second charge transistor $TL_F$ is also linked to a first storage node T of the cell 100, whereas the double gate of the first charge transistor $TL_T$ is linked to a second storage node F of the cell 100. The sources of the charge transistors $TL_T$, $TL_F$ are connected to each other and to a supply potential VDD, which may be for example around 1.2 Volt for gates of critical dimension of around 40 nanometres.

The drain of the first charge transistor $TL_T$ and the drain of the second charge transistor $TL_F$, are linked respectively to the first storage node T of the cell 100 and to the second storage node F of the cell 100. The cell 100 further comprises a first double gate conduction transistor $TD_T$, as well as a second double gate conduction transistor $TD_F$. The conduction transistors $TD_T$ and $TD_F$, may be produced in a type of MOS technology complementary to said first type, for example a NMOS technology. The two gates of the first conduction transistor $TD_T$ are connected together, whereas the two gates of the second conduction transistor $TD_F$ are also connected together. The double gate of the first conduction transistor $TD_T$ is also linked to the second storage node F, whereas the double gate of the second conduction transistor $TD_F$ is connected to the first storage node T of the cell 100. The sources of the conduction transistors $TD_T$, $TD_F$ are connected to each other and to a potential VSS. The potential VSS may be for example around 0 Volt. The drain of the second conduction transistor $TD_F$ and the drain of the first conduction transistor $TD_T$ are linked respectively to the second storage node F of the cell 100 and to the first storage node T of the cell 100.

The charge $TL_T$, $TL_F$ and conduction $TD_T$, $TD_F$ transistors form a bistable for the cell 100, and are provided to control and maintain an information saved by the storage nodes T, F.

The first storage node T, may be intended to conserve a given logic information, for example a '1' logic, whereas the second storage node F is intended to keep a complementary logic information of the logic information, for example a '0' logic.

The cell 100 is also equipped with a first double gate access transistor $TA_T$ and a second double gate access transistor $TA_F$, for example of NMOS type. The first access transistor $TA_T$ comprises a gate linked to a first word line $WL_1$ and another gate linked to a second word line $WL_2$. The first word line $WL_1$ and the second word line $WL_2$ are intended respectively, to carry a first bias potential and a second bias potential, enabling the access to the cell to be commanded. The manner in which the word lines $WL_1$ and $WL_2$ are biased respectively determines the different operating phases of the cell 100: reading, writing, and retention.

The second access transistor $TA_F$ is also equipped with a gate linked to the first word line $WL_1$ and a second gate linked to the second word line $WL_2$. The source of the first access transistor $TA_T$ is linked to a first bit line $BL_T$, whereas the source of the second access transistor $TA_F$ is connected to a second bit line $BL_F$. The bit lines $BL_T$ and $BL_F$ are capable in particular of transmitting data to be written in the cell. The drain of the first access transistor $TA_T$ is linked to the first node T, whereas the drain of the second access transistor $TA_F$ is linked to the second node F. The access transistors $TA_T$, $TA_F$, are laid out to enable the storage nodes T and F to be accessed, during a reading or writing phase of the cell 100, and block the access of the cell 100, when the cell 100 is in an information retention mode.

In this example, the first word line $WL_1$ is provided to carry a first bias potential that is capable of adopting 2 states, a state corresponding for example to a first potential value, for example Vss and a second state corresponding for example to a second potential value VDD, depending on whether the cell is placed in a reading, writing, or retention mode.

The second word line $WL_2$ is provided to carry a second bias potential that is capable of adopting at least 2 states, depending on whether the cell is placed in a retention, reading, or writing mode, a first state corresponding for example to a first potential value, for example VSS. The second word line $WL_2$ is also capable of being placed at an adaptable or modulable potential $V_{WL2ref}$, and intermediary between the first potential value, for example Vss and a second potential value, for example VDD. The second word line $WL_2$ is thereby capable of adopting several intermediate states between the first state and the second state, corresponding for example to several intermediate potential values between VSS and VDD, when the cell is placed in a reading mode.

According to one embodiment possibility (FIG. 8), the second word line $WL_2$ is also placed at the adaptable or modulable potential $V_{WL2ref}$, and intermediate between the first potential value, for example VSS and a second potential value, for example VDD, when the cell is placed in a writing mode.

According to an alternative embodiment (FIG. 9), the second word line $WL_2$ is capable of adopting another state corresponding for example to the second potential value, for example VDD, when the cell is placed in a writing mode.

In the example of cell illustrated in FIG. 3, in retention mode, the word lines $WL_1$ and $WL_2$ are placed respectively at a potential provided to block the access to the storage nodes, for example at the potential VSS.

In writing mode, the two word lines $WL_1$ and $WL_2$ are provided to activate the access transistors and generate a conduction current $I_{CELL}$ enabling the cell 100 to be commutated, with a difference of potential between the bit lines $BL_T$ and $BL_F$ preferably as low as possible. To do this, the two word lines $WL_1$ and $WL_2$ may be biased for example to VDD or according to the alternative embodiment evoked above, the first word line $WL_1$ is biased for example to VDD, whereas the second word line $WL_2$ is placed at the adaptable or modulable potential $V_{WL2ref}$, and VSS and VDD.

The use of double gate architecture transistors favours the attainment of the abovementioned condition in so far as, given the bias conditions, the access transistors $TA_T$, $TA_F$ will be equipped with two channels delivering a high current.

In reading mode, the compromise performance-stability of the cells of the memory according to the invention is improved by means of a reference circuit, capable of imposing for this reading mode a potential VWL2ref applied to one of the two word lines, for example to the second word line WL2. The first word line WL1 is biased to a potential making it possible to turn on the access transistors $TA_T$ and $TA_F$, for example VDD.

The value of the bias potential VWL2ref applied to the second word line of a cell during a reading operation on this cell is between the values of the bias potentials applied during retention and writing operations, and may be adapted so as to privilege the best compromise between stability and electrical performances of the cell.

The potential VWL2ref may be self-adaptable or self-adjustable. By "self-adaptable" or "self-adjustable", it is understood that it is capable of being modulated by means of a feedback loop.

The potential VWL2ref is capable of being adapted, as a function of the variations in the potential of a reference circuit node, which serves as reference node. The reference circuit may play the role of control circuit, in particular of environmental variations, for example of temperature and those of the supply voltage, and which are also capable of having an influence on the other cells of the memory. The value of the potential VWL2ref itself depends on a predetermined reference potential Vref. The reference potential Vref may have been predetermined for example as a function of a compromise between criteria of stability and desired electrical performances, moreover as a function of the best compromise between SNM reading stability and conduction current Icell. The reference circuit may be a reference memory cell.

Figure 4:
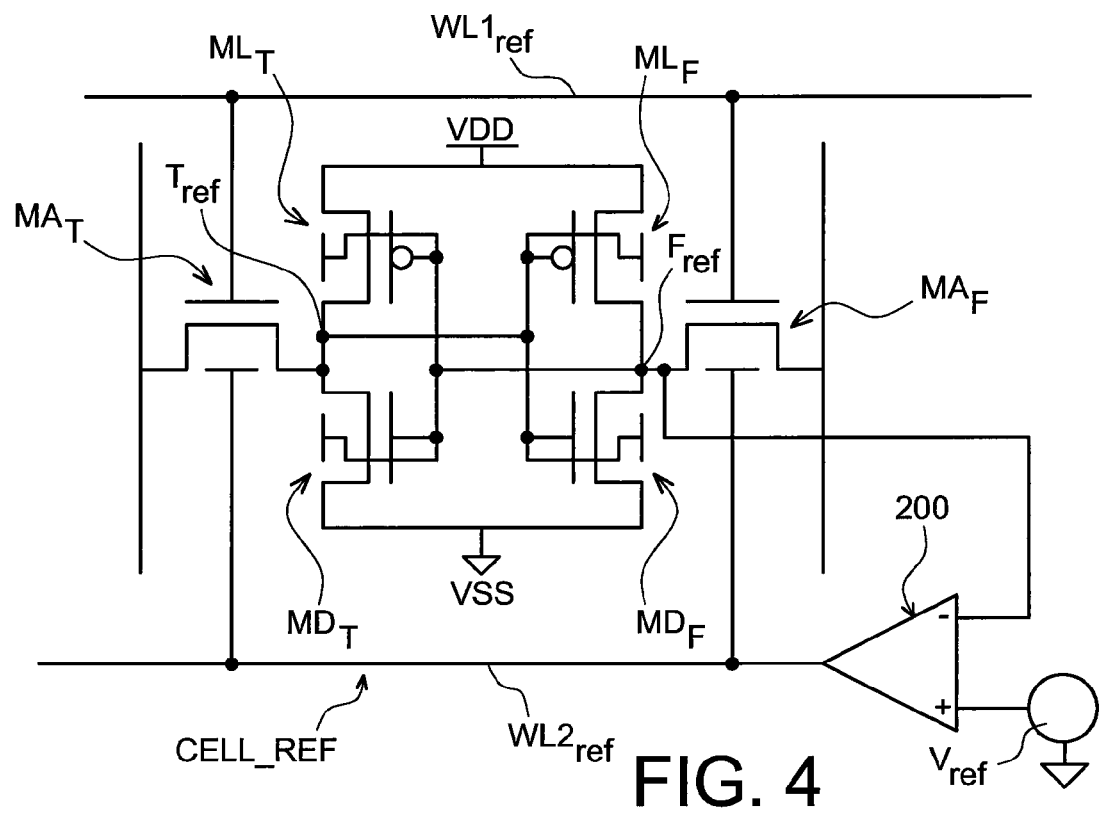
FIG. 4 illustrates an example of reference memory cell, provided to deliver the potential applied to one or several given memory cells of a SRAM memory according to the invention, during an operation of reading and if appropriate writing on these given cells, FIG. 5 gives curves representative of parameters characteristic of a reference memory cell according to the invention, as a function of the evolution of the potential of the second node of this cell, FIG. 6 gives normalised product curves of a static noise margin factor, raised to a given power, and conduction current of the cell in I_cell reading raised to another given power, FIGS. 7A-7B gives product curves of a static noise margin factor and high conduction current of the cell in I_cell reading, respectively, as a function of the variations in supply potential and as a function of the variations in processes.

FIG. 4 illustrates an example of reference circuit, provided to deliver the potential VWL2ref that the second word line of one or several cell(s) on which a reading access is carried out, carries or carry. This reference circuit is in the form of a reference memory cell or a reference memory cell noted CELL_REF, having a lay out similar to that of the cell 100. The transistors of the reference cell may be identical to those of the other cells.

The reference cell CELL_REF comprises a first double gate charge transistor $ML_T$, a second double gate charge transistor $ML_F$, a first double gate conduction transistor $MD_T$, a second double gate conduction transistor $MD_F$. The transistors $ML_T$, $ML_F$, $MD_T$, $MD_F$, form a bistable, and are provided to control and maintain an information saved by reference storage nodes $T_{ref}$, $F_{ref}$ the first reference storage node $T_{ref}$ being for example intended to conserve a '1' logic information, whereas the second reference storage node $F_{ref}$ is intended to save a '0' logic information.

The reference memory cell CELL_REF is also equipped with a first double gate access transistor $MA_T$ and a second double gate access transistor $MA_F$. The reference cell CELL_REF further comprises a first word line $WL_{1ref}$ and a second word line $WL_{2ref}$.

The memory cell reference CELL_REF can be equipped with bits lines BLTref, BLFref that can be biased to a voltage equivalent to a potential called "pre-charge potential" of bit lines of the matrix cells or possibly at a higher potential, especially if the pre-charge" potential is less than the supply voltage VDD.

The "pre-charge" pontential, in this case, corresponds to the highest potential that could be applied on the bit lines of a cell during the various phases of operation.

The biasing of bits lines of the cell reference may be applied continuously to simulate a worst case of operation that would correspond to the biasing of the bit lines during the beginning of a reading cycle when the bit lines are at the highest potential.

The feedback loop may be implemented by means of means forming an operational amplifier 200 in which the inverting terminal is connected to the second reference node $F_{ref}$ and comprises a non-inverter terminal to which is applied the predetermined reference potential Vref.

The output of the operational amplifier 200 is linked to the second word line $WL_{2ref}$ of the reference cell CELL_REF, and thereby delivers the potential VWL2ref that adapts as a function of the variations in the potential of the second reference node $F_{ref}$ of the cell CELL_REF. The output of the operational amplifier 200 is also linked respectively to a gate of the access transistors $MA_T$ and $MA_F$. The potential VWL2REF is proportional to the voltage difference between the predetermined reference potential Vref and the potential of the second node $F_{ref}$, in such a way that VWL2ref=(VREF−V(F))*G where G is the gain of the amplifier. The amplifier may be supplied between 0V and VDD. If V(F)>VREF then VWL2REF=VSATmin (where VSATmin~50 mV). If V(F)<VREF then VSATmin<VWL2REF<VSATmax (where VSATmax=VDD−100 mV).

The feedback loop enables the increase in the potential of the reference node $F_{ref}$ to be limited, in so far as, when the potential of the reference node $F_{ref}$ increases, the conduction of the transistor $TA_F$ is reduced by the reduction in the potential VWL2ref applied to the second word line WL2ref of the reference cell, which has a tendency to reduce the potential of reference node $F_{ref}$ (reduces the quantity of charges injected in $F_{ref}$ by the transistor $TA_F$). The potential of the reference node $F_{ref}$ thus has a tendency to maintain itself at a potential below the predetermined reference potential Vref. The feedback loop enables a self-regulated system to be implemented making it possible to ensure the return of the potential F to a given value, following variations in this potential, due for example to environmental factors, for example variation in temperature or variation in supply voltage.

The potential VWL2ref of the second word line WL2ref of the reference cell is applied to the cells on which a reading operation is carried out. For the retention mode, the second word line WL2ref of the reference cell CELL_REF is isolated. According to one embodiment possibility (FIG. 8), the potential VWL2ref of the second word line WL2ref of the reference cell may also be applied to the cells on which a writing operation is carried out.

The implementation of the reference cell CELL_REF makes it possible to maintain the voltage of the node F of the cells on which a reading access is carried out below a predetermined threshold, as a function of the desired performance—stability compromise.

The choice of the reference voltage Vref may be determined from a compromise, between static noise margin SNM and value of the conduction current of the cell Icell_rd during a reading operation. Such a compromise may be determined by means of a relation between static noise margin SNM for example by means of the product between the static noise margin SNM and that of the conduction current of the cell Icell_rd measured for different potential values at the reference node $F_{ref}$.

Figure 5:
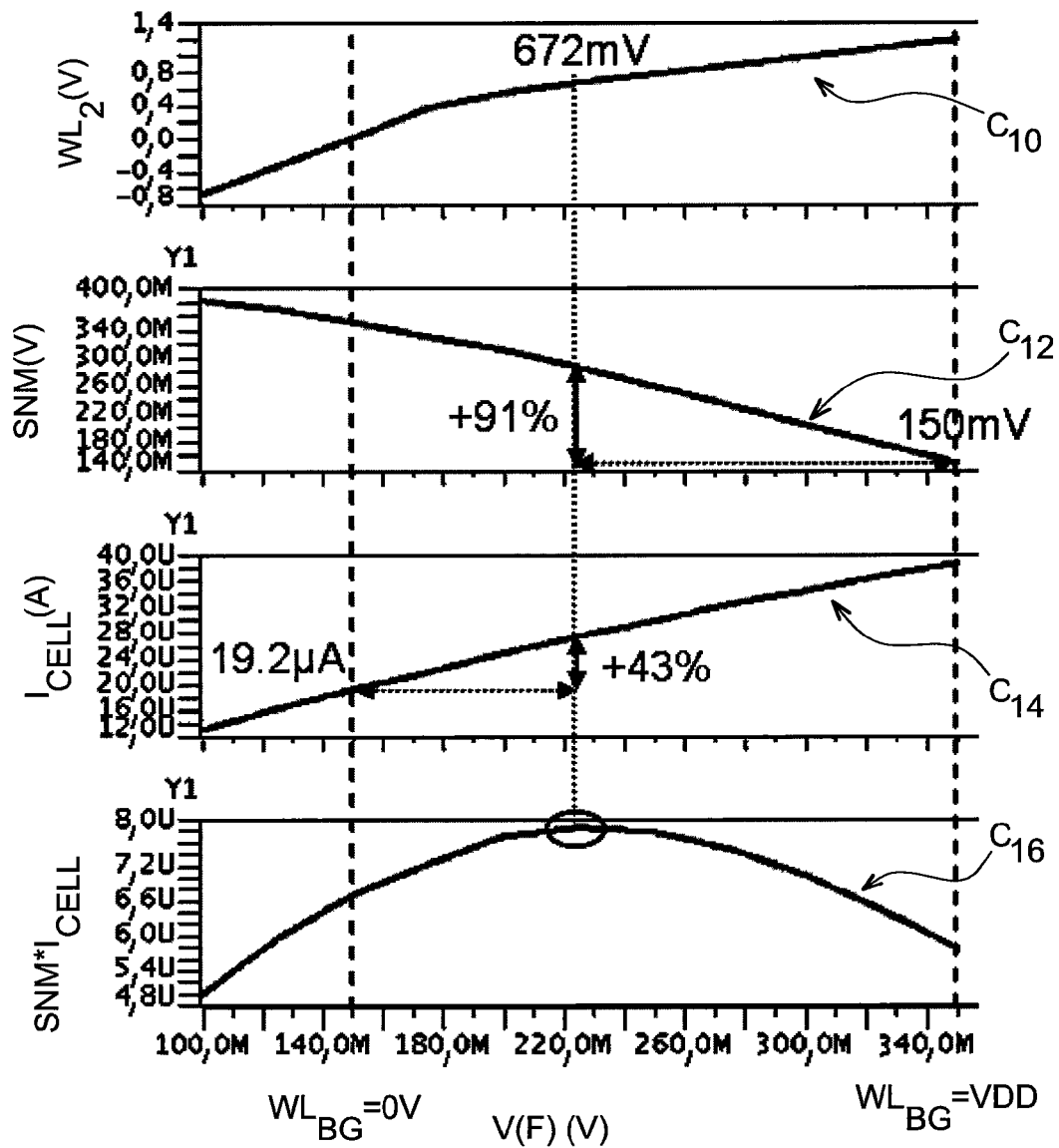

FIG. 5 illustrates examples of curves $C_{10}$, $C_{12}$, $C_{14}$, $C_{16}$ representative respectively of the product Icell*SNM, of the conduction current Icell, the reading stability SNM, and the potential VWL2 capable of being applied to the word line, each as a function of the potential of the reference node $F_{ref}$.

With the increase in the potential F the static noise margin SNM reduces (curve $C_{12}$ decreasing) and $I_{CELL}$ increases (curve $C_{14}$ increasing). The product of the two characteristics (curve C16) gives an optimum (point C161 of the curve C16), which corresponds to the best compromise between stability and performance. In this example, the optimum corresponds to a potential F for example of 220 mV for a useful potential $VWL_2$ of 672 mV. Compared to extreme bias points if $VWL_2$ was equal to Vss=0 Volt and if $VWL_2$ was equal to VDD=1.2 Volt, the static noise margin SNM is increased 91% and $I_{CELL}$ 43% when the optimum $C_{161}$ of the curve C16 is chosen.

According to an alternative embodiment, the choice of the reference potential Vref may be made by privileging one of the two criteria of SNM reading stability and reading conduction current Icell_rd.

For example, the criterion of stability in SNM reading may be privileged compared to the conduction current Icell, by choosing the reference potential Vref by determining the optimum of a product Icell_rd*$SNM^2$.

According to another example, the conduction current Icell may be privileged compared to the criterion of SNM reading stability, by choosing the reference potential Vref by determining the optimum of a product Icell_$rd^2$*SNM.

Figure 6:
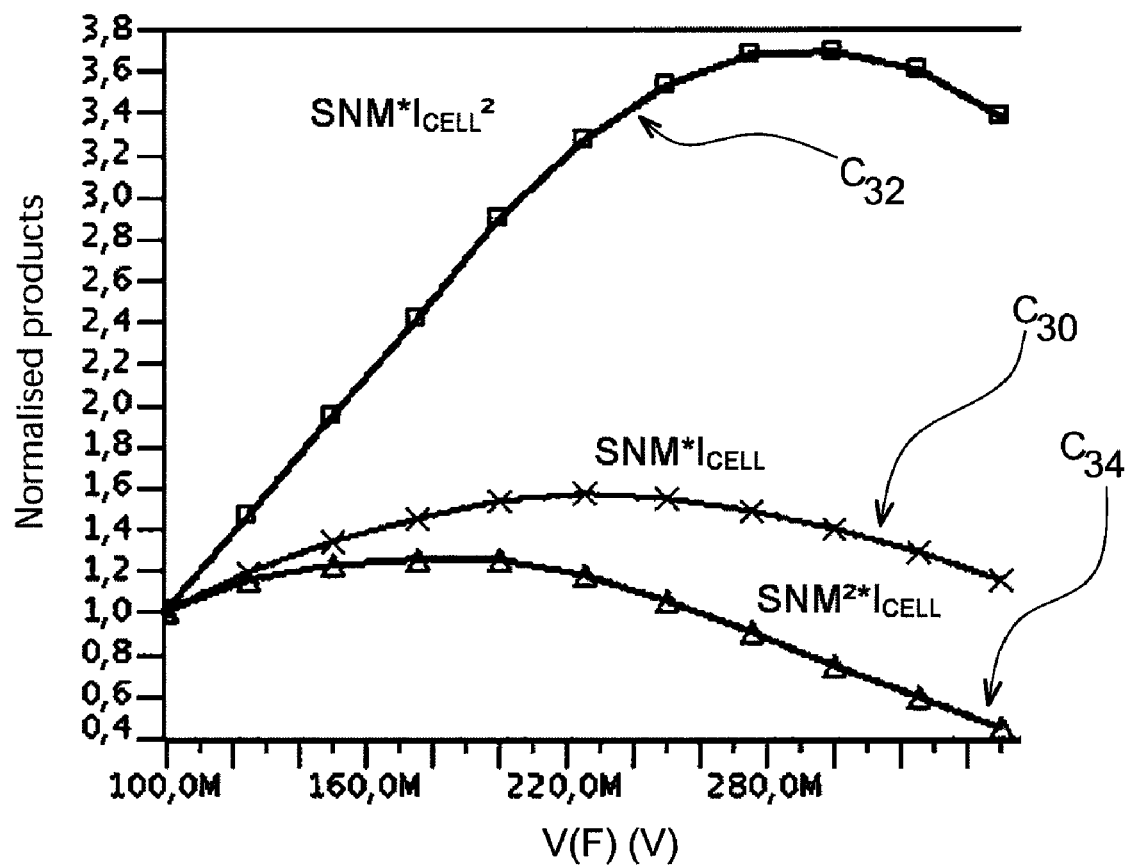

FIG. 6 illustrates examples of curves $C_{30}$, $C_{32}$, $C_{34}$, representative respectively of a product Icell_rd*SNM, a product Icell_rd*$SNM^2$, the product (Icell_rd)$^2$*SNM, and the potential VWL2ref capable of being applied to the second word line of the cells accessed in reading, each as a function of the potential of the second node.

The table below provides a comparison between the electrical characteristics of the cell 100, with a feedback system to those respectively of a similar cell noted 6T-2WL, in double gate technology and which would not be associated with a feedback, and those of a standard SRAM cell with shared gate noted 6T-DG. The column noted "100*" corresponds to the performances of the cell 100 at which the potential VWL2ref during writing operations would also be applied.

The results have been obtained for a gate technology of dimension of around 40 nm, with transistors of size such that W=76 nm, and L=40 nm.

The NBL factor characterises the number of cells per bit line, calculated compared to a leakage current from the access transistors $I_{PG}$ and to the conduction current of the cell in reading mode ($I_{CELL\_RD}$), such that:

$$NBL = \frac{I_{CELL}}{I_{PG}} > x \cdot lignes$$

This factor should preferably be greater than x times the number of word lines, where x is a margin factor normally between 5 and 10. $I_{CELL\_WR}$ gives the conduction current of the cell in writing. The behaviour of the cell compared to the reading and writing cycles is determined in a manner respectively by the static noise margin SNM and writing margin WM.

The results have been obtained under typical conditions of 27° C., a supply of around 1.2 V.

For a minimum dimensioning of the transistors and under typical simulation conditions, the cell 6T-DG has a particularly low SNM which may be around 67 mV and the cell 6T-2WL the lowest current reading and NBL factor.

The cell 100 has the best static noise margin electrical performance compromise.

|  | Cells | | | |
| --- | --- | --- | --- | --- |
|  | 6T-DG | 6T-2WL | 100 | 100* |
| $I_{OFF}$ (pA) | 674 | 674 | 674 | 674 |
| $I_{PG}$ (pA) |  | 268 |  |  |
| $I_{CELL\_RD}$ (µA) | 38.6 | 19.1 | 27.5 | 27.5 |
| $I_{CELL\_WR}$ (µA) | 38.6 |  | 27.5 | 38.6 |
| NBL (x$10^3$) | 144 | 71 | 102 | 102 |
| SNM (mV) | 67 | 351 | 285 | 285 |
| WM (mV) | 571 |  | 271 | 571 |

Figures 7A, 7B:
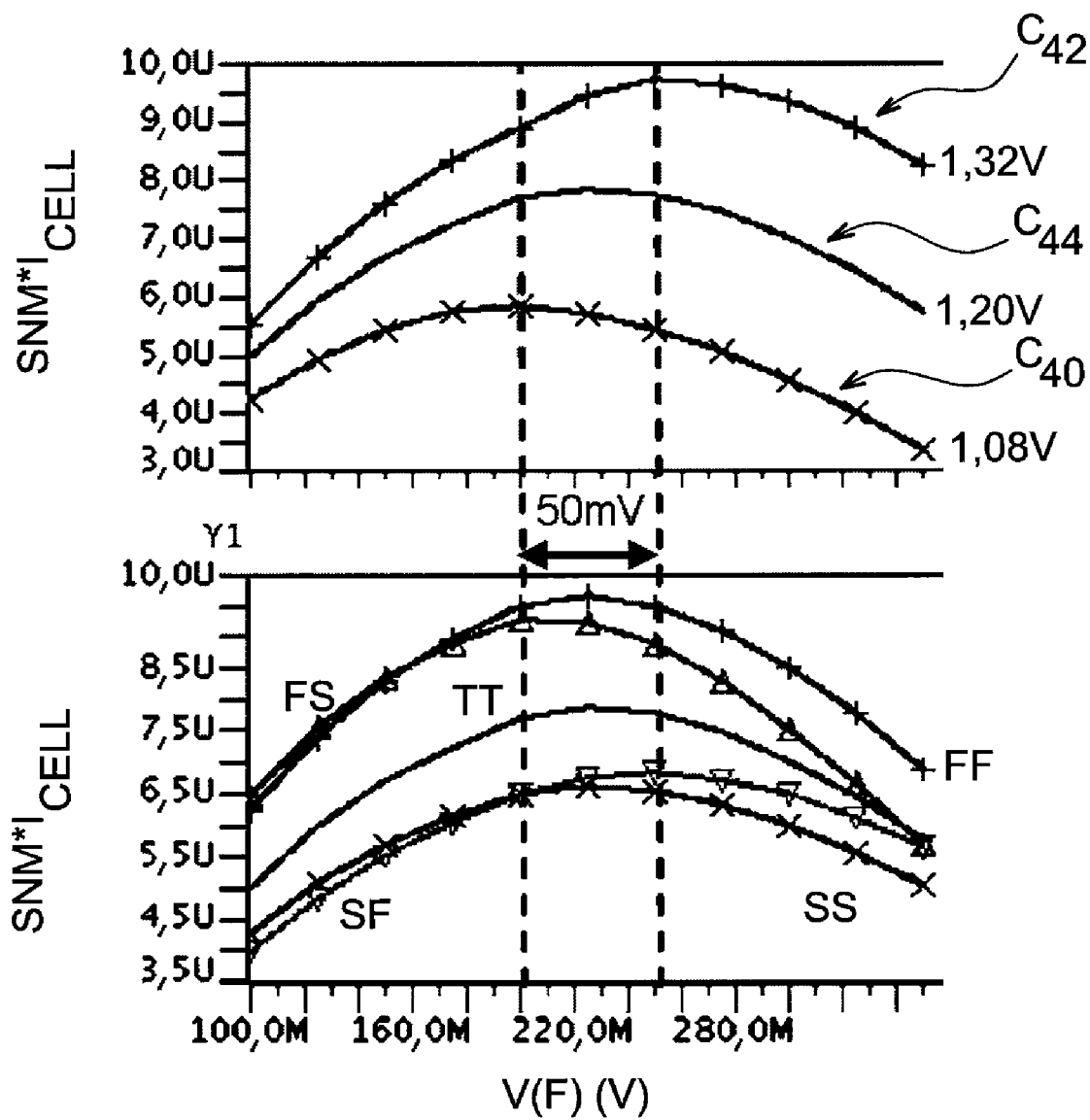

FIG. 7A shows the variations in the optimum between the static noise margin SNM and the conduction current $I_{CELL\_rd}$ of the cell 100, for various values of supply voltages. In this figure:
- the curve $C_{40}$ is representative of a product Icell*SNM measured on the cell 100, for a supply voltage of 1.08 Volts,
- the curve $C_{42}$ is representative respectively of the product Icell*SNM measured on the cell 100, for a supply voltage of 1.20 Volt,
- the curve $C_{44}$ is representative respectively of the product Icell*SNM measured on the cell 100, for a supply voltage of 1.32 Volt.

FIG. 7B shows for its part the variations in the optimum between the static noise margin SNM and the conduction current $I_{CELL}$ of the cell 100, for fluctuations in the manufacturing process. The low variation in the optimum in FIGS. 7A and 7B shows a good tolerance of an example of memory designed according to the invention to the variations in supply voltage and manufacturing process.

Figure 8:
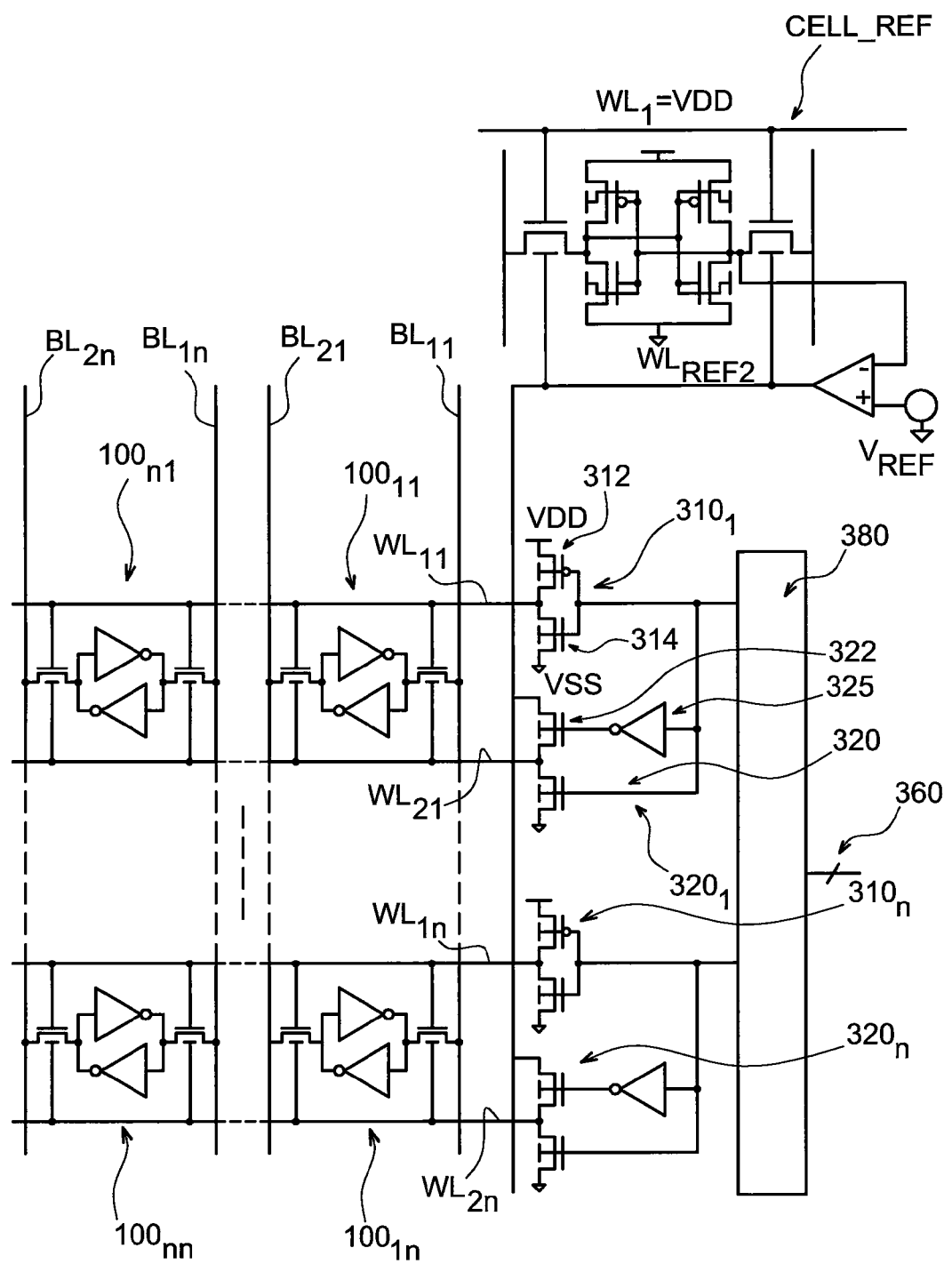
FIG. 8 illustrates an example of matrix of memory cells implemented according to the invention, and comprising a reference memory cell, making it possible to deliver a potential to apply to the memory cells on which a reading operation and a writing operation are carried out.

In FIG. 8, an example of SRAM memory equipped with a plurality of n*n cells $100_{11}, \ldots, 100_{1n}, \ldots, 100_{n1}, \ldots, 100_{nn}$ such as the cell 100 previously described in relation to FIG. 3, is represented. The memory is also equipped with a reference memory cell such as the cell cell_REF previously described in relation to FIG. 4.

Each memory row may be associated with first switching means and with second switching means.

The cells $100_{11}, \ldots, 100_{1n}$ of a same row share a same first word line $WL_{11}$ and a same second word line $WL_{21}$ and are associated with first switching means $310_1$ provided to connect the first word line $WL_{11}$ to a first potential, for example equal to VDD or to a second potential VSS, according to whether one carries out an access in reading, in writing, or whether one is in a retention mode. The first word line $WL_{11}$ is thereby capable of adopting two states or two values of different potentials VDD and VSS.

The cells $100_{11}, \ldots, 100_{1n}$ of a same row are also associated with second switching means $320_1$ provided to connect the second word line $WL_{21}$ to the second word line WLref2 of the reference cell, when a reading or writing access on one or several cells of said row is carried out, or to connect the second word line $WL_{21}$ to a second potential, for example equal to VSS when the cells of the row are in retention mode. The matrix of cells may also comprise a decoder 350 and an address bus, dedicated to the selection of the word lines and to switch the switching means $310_1, 320_1, 310_n, 320_n$.

The first switching means $310_1$ $310_n$ may be provided for example in the form of two double gate transistors 312, 314 connected between VDD and VSS and forming a CMOS inverter at the output of the decoder 350.

the second switching means $320_1$ $320_n$ may comprise for example two double gate transistors 322, 324 with common gates and common sources, one of the transistors having an electrode connected to the second word line of the reference cell CELL_REF, as well as an inverter 325 situated at the output of the decoder 350 and connected to the gates of the transistor 322.

In this device, each memory row may be associated with first switching means and second switching means.

The cells $100_{11}, \ldots, 100_{1n}$ of a same row share a same first word line $WL_{11}$ and a same second word line $WL_{21}$ and are associated with first switching means $310_1$ capable of connecting the first word line $WL_{11}$ to a first potential, for example equal to VDD or to a second potential VSS, according to whether one carries out an access in reading, in writing or whether one is in a retention mode. The first word line $WL_{11}$ is thereby capable of adopting two states or two values of different potentials VDD and VSS.

The cells $100_{11}, \ldots, 100_{1n}$ of a same row are also associated with second switching means $320_1$ suited to connecting the second word line $WL_{21}$ to the second word line WLref2 of the reference cell, when an access in reading or in writing is carried out on one or several cells of said row, or to connecting the second word line $WL_{21}$ to a second potential, for example equal to VSS when the cells of the row are in retention mode. The matrix of cells may also comprise a decoder 350 and an address bus, dedicated to the selection of word lines and commutating the switching means $310_1, 320_1, 310_n, 320_n$.

Figure 9:
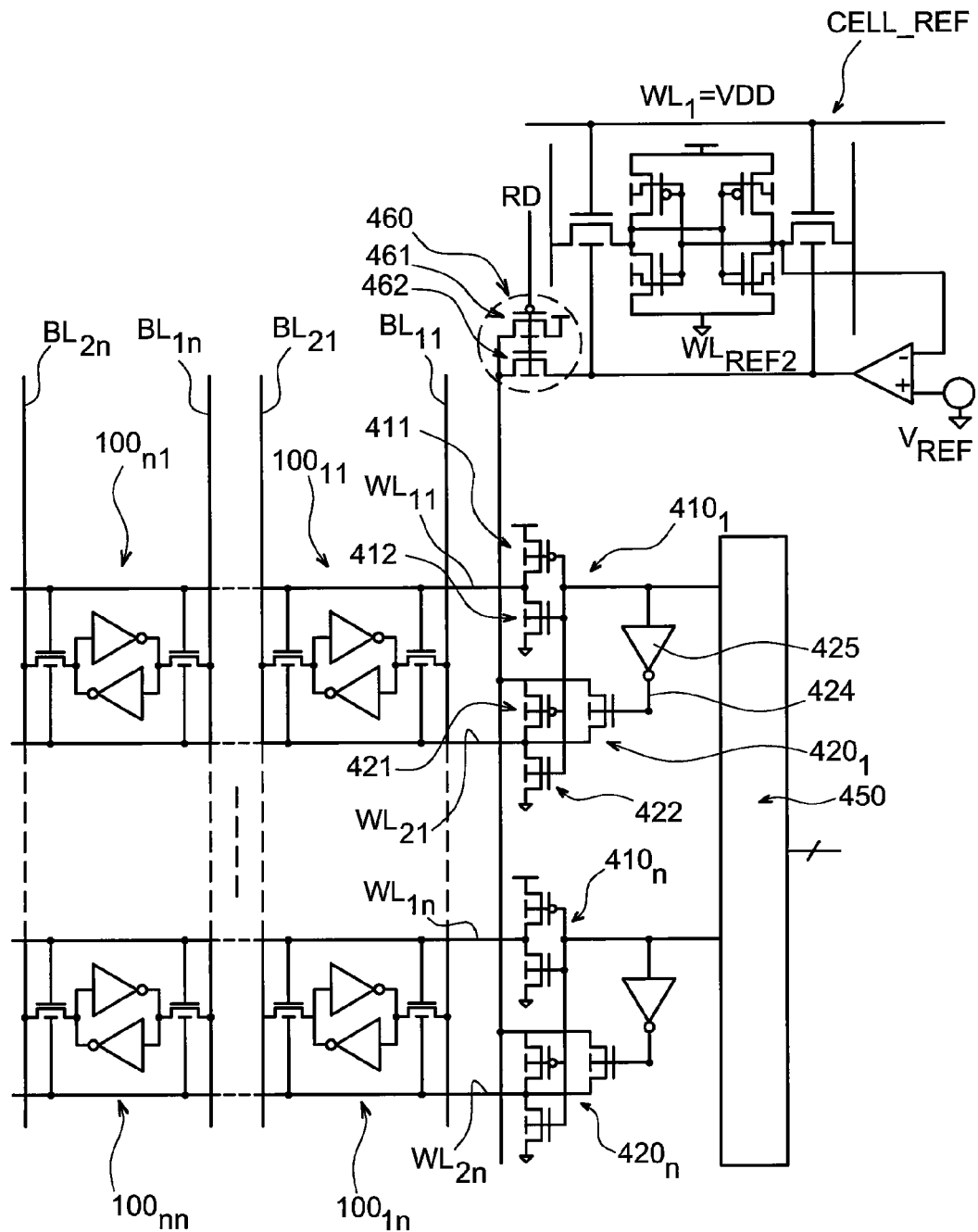
FIG. 9 illustrates another example of matrix of memory cells implemented according to the invention, and comprising a reference memory cell.

In FIG. 9, another example of SRAM memory equipped with a plurality of n*n cells $100_{11}, \ldots, 100_{1n}, \ldots, 100_{n1}, \ldots, 100_{nn}$ and a reference memory cell such that the cell cell_REF, is given.

The cells $100_{11}, \ldots, 100_{1n}$ of a same row share a same first word line $WL_{11}$ and a same second word line $WL_{21}$ and are associated with first switching means $410_1$ capable of connecting the first word line $WL_{11}$ to a first potential, for example equal to VDD or to a second potential VSS, according to whether one carries out an access in reading, in writing, or whether one is in a retention mode. The first word line $WL_{11}$ is thereby capable of adopting two states or two different values of potentials VDD and VSS.

The first switching means $410_1$ $410_n$ may comprise for example two double gate transistors 412, 414 connected between VDD and VSS and forming a CMOS inverter at the output of a line decoder 450.

The cells $100_{11}, \ldots, 100_{1n}$ of a same row are also associated with second switching means $420_1$ suited to connecting the second word line $WL_{21}$ to the second word line WLref2 of the reference cell, when a reading access on one or several cells of said row is carried out, to connecting the second word line $WL_{21}$ to a second potential, for example equal to VSS when the cells of the row are in retention mode, and to connect the second word line $WL_{21}$ to a potential VDD, when a reading access on one or several cells of said row is carried out.

In this example, the voltage applied to the second word line is different depending on whether one is in reading or writing mode. The second word line $WL_2$ is capable of adopting a state corresponding for example to the second potential value, for example VDD, when the cell is placed in a writing mode.

To do this, the second switching means $420_1$ $420_n$ comprise means 460 actuated by a phase reading indication signal RD, and provided to deliver a potential equal to VDD when reading the indication signal is inactive, for example equal to 0 V and deliver the potential of the second word line WL2ref of the reference cell CELL_REF, when the RD operation reading indication signal is active, for example equal to VDD. The means 460 may be for example in the form of 2 double gate transistors 461, 462, the gates of which are commanded by the RD reading operation indication signal.

The second switching means $420_1, \ldots, 420_n$ may further comprise double gate transistors 421, 422 laid out in CMOS inverter and the gates of which are connected to those of the transistors 411, 412 of the first switching means.

The second switching means $420_1, \ldots, 420_n$ may further comprise a double gate switching transistor 424 capable of connecting the input of the CMOS inverter to the output switching means 460, as a function of the signal delivered by another inverter 425, situated between this switching transistor 424 and an output of the decoder 450.

DOCUMENTS CITED

Publications

[CHA'01]: A. CHANDRAKASAN, et al., "*Design of High-Performance Microprocessor Circuits*", IEEE press, pp. 285-308, FOX 2001.

[KIM'05]: J. J. KIM, et al., "*Back-Gate Controlled READ SRAM with Improved Stability*", IEEE SOI CONFERENCE, pp. 211-212, Hawaii, USA, 2005.

[SEE'87]: E. SEEVINCK, et al., "*Static-Noise Margin Analysis of MOS SRAM Cells*", IEEE JSSC, VOL. SC-22, No. 5, October 1987.

[TAK'O 1]: K. Takeuchi, et al., "*A Study of Threshold Voltage Variation for Ultra SmallBulk and SOI CMOS*", IEEE TED, VOL. 48, No. 9, September 2004.

[YAM'041]: M. YAMAOKA, et al., "*Low Power SRAM Menu for SOC Application Using Yin-Yang-Feedback memory Ccli Technology*", Symposium on VLSI circuits, Digest of Technical Papers, Honolulu, USA, June 2004.

The invention claimed is:

1. Random access memory microelectronic device, comprising a plurality of cells comprising respectively:
    a plurality of transistors forming a bistable,
    a first storage node and a second storage node,
    a first double gate access transistor to the first storage node and a second double gate access transistor to the second storage node, a first gate of the first access transistor and a first gate of the second access transistor being linked to a first word line, a second gate of the first access transistor and a second gate of the second access transistor being linked to a second word line,
    the device being further equipped: with a reference memory cell provided to deliver a bias potential intended to be applied to one of the respective word lines of one or several given cells of said plurality of cells during reading access of said given cells.

2. Random access memory microelectronic device according to claim 1, the reference cell comprising: a first reference storage node and a second reference storage node, said bias potential delivered by the reference memory cell being dependent on a predetermined reference potential.

3. Random access memory microelectronic device according to claim 1, the reference cell comprising: a first reference storage node and a second reference storage node, said bias potential delivered by the reference memory cell being dependent on a predetermined reference potential and being adapted as a function of the variations in a potential of the second reference node of the reference cell.

4. Random access memory microelectronic device according to claim 3, the reference cell comprising: means forming a feedback loop, provided to reduce the potential of the second reference node of the reference cell following an increase in potential of the second reference node.

5. Random access memory microelectronic device according to claim 4, in which the feedback loop is produced by means forming an operational amplifier comprising:
- an inverting input connected to the second node of the reference cell,
- a non-inverting input to which the predetermined reference potential is applied,
- an output delivering said bias potential.

6. Random access memory microelectronic device according to one of claim 2, in which the first word line is suited to be placed at a first potential value or at a second potential value, the reference potential being provided in such a way that the bias potential is greater than the first value and less than the second value.

7. Random access memory microelectronic device according to claim 1, the reference cell further comprising:
- a plurality of transistors forming a bistable,
- a first double gate access transistor to the first reference node and a second double gate access transistor to the second reference node,
- a first gate of the first access transistor and a first gate of the second access transistor being linked to a first word line, a second gate of the first access transistor and a second gate of the second access transistor being linked to a second word line provided to deliver said bias potential.

8. Random access memory microelectronic device according to claim 7, in which the first word line of the reference cell is at a potential provided to assure the conduction of access transistors of the reference cell, the given bias potential being carried by the second word line of the reference cell.

9. Random access memory microelectronic device according to claim 1, the reference cell comprising a plurality of transistors having an identical lay out to that of the transistors of the cells of said plurality of cells.

10. Random access memory microelectronic device according to claim 1, further comprising:
- first switching means suited to placing the first word line of one or several cells at a first potential or at a second potential,
- second switching means suited to placing the second word line of one or several cells at said first potential or at said given bias potential.

11. Random access memory microelectronic device according to claim 1, said given bias potential being intended to be applied to one of the respective word lines of one or several given cells of said plurality of cells during writing access of said given cells.

12. Random access memory microelectronic device according to claim 1, in which different bias potentials are intended to be applied to one of the respective word lines of one or several given cells of said plurality of cells depending on whether said given cells are accessed in reading, writing or are in retention mode.

13. Random access memory microelectronic device according to claim 12, further comprising:
- means for placing the first word line of one or several cells at a first potential or at a second potential,
- means for placing the second word line of one or several cells at said first potential or at said second potential or at said given bias potential.

\* \* \* \* \*